US012525774B2

(12) United States Patent
Like

(10) Patent No.: US 12,525,774 B2
(45) Date of Patent: Jan. 13, 2026

(54) ELECTRIC JUNCTION BOX ASSEMBLY WITH REMOVABLE COVER

(71) Applicant: Sumitomo Wiring Systems, Ltd., Yokkaichi (JP)

(72) Inventor: Nathan Like, Farmington Hills, MI (US)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 210 days.

(21) Appl. No.: 18/390,638

(22) Filed: Dec. 20, 2023

(65) Prior Publication Data

US 2025/0210951 A1    Jun. 26, 2025

(51) Int. Cl.
| | | |
|---|---|---|
| H02G 3/08 | (2006.01) | |
| H01R 13/24 | (2006.01) | |
| H01R 13/70 | (2006.01) | |
| H02G 3/14 | (2006.01) | |
| H02G 3/16 | (2006.01) | |
| H05K 5/02 | (2006.01) | |
| H05K 5/13 | (2025.01) | |

(52) U.S. Cl.
CPC ......... *H02G 3/081* (2013.01); *H01R 13/2442* (2013.01); *H01R 13/701* (2013.01); *H02G 3/14* (2013.01); *H02G 3/16* (2013.01); *H05K 5/0226* (2013.01); *H05K 5/0247* (2013.01); *H05K 5/13* (2025.01)

(58) Field of Classification Search
CPC ...... H05K 5/13; H05K 5/0247; H05K 5/0226; H02G 3/16; H02G 3/14; H02G 3/081; H01R 13/701; H01R 13/2442; B60R 16/0238
See application file for complete search history.

(56) References Cited

U.S. PATENT DOCUMENTS 8,427,816 B2 *    4/2013    Kwon .................. B60L 3/0069
439/76.2

FOREIGN PATENT DOCUMENTS

| CN | 105329190 B | 8/2016 |
|---|---|---|
| CN | 105984405 A | 10/2016 |
| DE | 202014102609 U1 | 9/2015 |
| JP | 2012148673 A | 8/2012 |
| KR | 102460150 B1 | 10/2022 |

* cited by examiner

*Primary Examiner* — Timothy J Thompson
*Assistant Examiner* — Rhadames Alonzo Miller
(74) *Attorney, Agent, or Firm* — Honigman, LLP; John Chau

(57) ABSTRACT

An electric junction box assembly includes a biasing member formed of an electrically conductive material. The biasing member has a first end fixed to a first terminal and a second end spaced apart from a second terminal. An upper cover includes a resilient prong disposed above the second end of the biasing member, wherein a top cover is configured to: (1) press the resilient prong is against the second end of the biasing member to place the first terminal in electric contact with the second terminal; and (2) allow the resilient prong to be free of the second end of the biasing member when the top cover is removed wherein the second end of the biasing member is spaced apart from the other of the first terminal and the second terminal and disconnect power.

16 Claims, 5 Drawing Sheets

ELECTRIC JUNCTION BOX ASSEMBLY WITH REMOVABLE COVER

TECHNICAL FIELD

The present specification generally relates to an electric junction box assembly and more particularly to an electric junction box assembly having a removable cover for disconnecting power.

BACKGROUND

In general, an electric junction box assembly is used in a platform, such as an automotive vehicle, to distribute power throughout the vehicle. The electric junction box assembly includes a housing enclosed by a top cover. The housing holds electric components which are configured to distribute power from a power source, such as a battery to electric component throughout the vehicle.

The electric junction box assembly includes power terminals for which wires are coupled to on one end and the battery on the other end. The electric junction box is mounted in the vehicle and competes with other devices for packaging space. As such, maintenance of the electric junction box may be difficult as access to the power terminals may be difficult. However, it is desirable to make sure that the power is disconnected before maintenance is performed. To ensure that the power is disconnected, the wires may be disconnected from the power terminals. However, removing the wires may be time consuming in instances where the power terminals are not easily accessible due to packaging constraints. Further, in almost every case, the top cover must be removed in order to perform maintenance.

Accordingly, it remains desirable to have an electric junction box assembly configured to disconnect from power by simply removing the top cover.

SUMMARY

In one aspect, an electric junction box assembly is provided. The electric junction box assembly is configured to distribute power from a battery to a plurality of electric devices. The electric junction box assembly includes an outer case having an open top and a top cover configured to close the open top. The electric junction box further includes an inner case disposed in the outer case. The inner case includes an open top and an upper cover configured to close the open top. A first terminal and a second terminal are spaced apart from each other and disposed in the inner case. A biasing member is also disposed in the inner case. The biasing member is formed of an electrically conductive material and has a first end fixed to one of the first terminal and the second terminal and a second end spaced apart from the other of the first terminal and the second terminal. The upper cover includes a resilient prong disposed above the second end of the biasing member. The top cover is configured to: (1) press the resilient prong against the second end of the biasing member to place the first terminal in electric contact with the second terminal when the top cover is mounted onto the outer case; and (2) allow the resilient prong to be free of the second end of the biasing member when the top cover is removed so as to allow the second end of the biasing member to be spaced apart from the other of the first terminal and the second terminal and disconnect power.

In one aspect, the electric junction box further includes a first tower and a second tower disposed in the inner case. The first tower and the second tower are spaced apart from each other. The first terminal is mounted on the first tower and the second terminal is mounted on the second tower.

In one aspect, the biasing member a body portion and a projection portion. The body portion may include an aperture for attachment to the one of the first terminal and the second terminal. In such an aspect, the projection portion may include a first portion and a second portion wherein the first portion tapers to the second portion and the second portion is a finger having a uniform diameter. The biasing member may include a seat portion extending downwardly from the first end, wherein the seat portion has a seat surface that is orthogonal to the bottom surface of the first end.

In one aspect, the first tower and the second tower are the same height.

In one aspect, the prong may be hingedly connected to the upper cover. The prong may be a planar member configured to cover an inner case opening.

In one aspect, a difference between a top surface of the other of the first terminal and the second terminal and an inner surface of the upper cover is substantially equal to a thickness of the biasing member. The difference between the top surface of the other of the first terminal and the second terminal and the inner surface of the upper cover may be substantially equal to a thickness of the projection portion of the biasing member.

In one aspect, a top surface of the one of the first terminal and the second terminal is spaced apart from an inner surface of the upper cover. In another aspect, the top cover includes at least one bolt hole and the outer case includes a bore configured to receive a first fastener. In such an aspect, the at least one bolt hole is registered to the bore when the top cover is mounted and the first fastener is seated in the at least one bolt hole and the bore to secure the top cover to the outer case. In such an aspect, a bottom surface of the top cover contacts the top surface of the upper cover when the top cover is mounted.

According to one aspect, the electric junction box assembly includes a top cover and an inner case having a biasing member formed of an electrically conductive material and an upper cover including a resilient prong, wherein the top cover is configured to press the resilient prong against the second end of the biasing member to place the first terminal in electric contact with the second terminal when the top cover is mounted onto the outer case and allow the resilient prong to be free of the second end of the biasing member when the top cover is removed so as to allow the second end of the biasing member to be spaced apart from the other of the first terminal and the second terminal and disconnect power. Accordingly, the electric junction box disclosed herein allows power to be disconnected by simply removing the top cover so as to allow for maintenance to be performed.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

DETAILED DESCRIPTION OF PREFERRED EMBODIMENTS

Example configurations will now be described more fully with reference to the accompanying drawings. Example configurations are provided so that this disclosure will be thorough, and will fully convey the scope of the disclosure to those of ordinary skill in the art. Specific details are set forth such as examples of specific components, devices, and methods, to provide a thorough understanding of configurations of the present disclosure. It will be apparent to those of ordinary skill in the art that specific details need not be employed, that example configurations may be embodied in many different forms, and that the specific details and the example configurations should not be construed to limit the scope of the disclosure.

The terminology used herein is for the purpose of describing particular exemplary configurations only and is not intended to be limiting. As used herein, the singular articles "a," "an," and "the" may be intended to include the plural forms as well, unless the context clearly indicates otherwise. The terms "comprises," "comprising," "including," and "having," are inclusive and therefore specify the presence of features, steps, operations, elements, and/or components, but do not preclude the presence or addition of one or more other features, steps, operations, elements, components, and/or groups thereof. The method steps, processes, and operations described herein are not to be construed as necessarily requiring their performance in the particular order discussed or illustrated, unless specifically identified as an order of performance. Additional or alternative steps may be employed.

When an element or layer is referred to as being "on," "engaged to," "connected to," "attached to," or "coupled to" another element or layer, it may be directly on, engaged, connected, attached, or coupled to the other element or layer, or intervening elements or layers may be present. In contrast, when an element is referred to as being "directly on," "directly engaged to," "directly connected to," "directly attached to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Referring generally to the figures, embodiments of the present disclosure include an electric junction box assembly having a top cover removably attached to an outer case wherein the top cover is configured to disconnect power within the electric junction box. Accordingly, the electric junction box disclosed herein allows power to be disconnected by simply removing the top cover so as to allow for maintenance to be performed.

Figure 1:
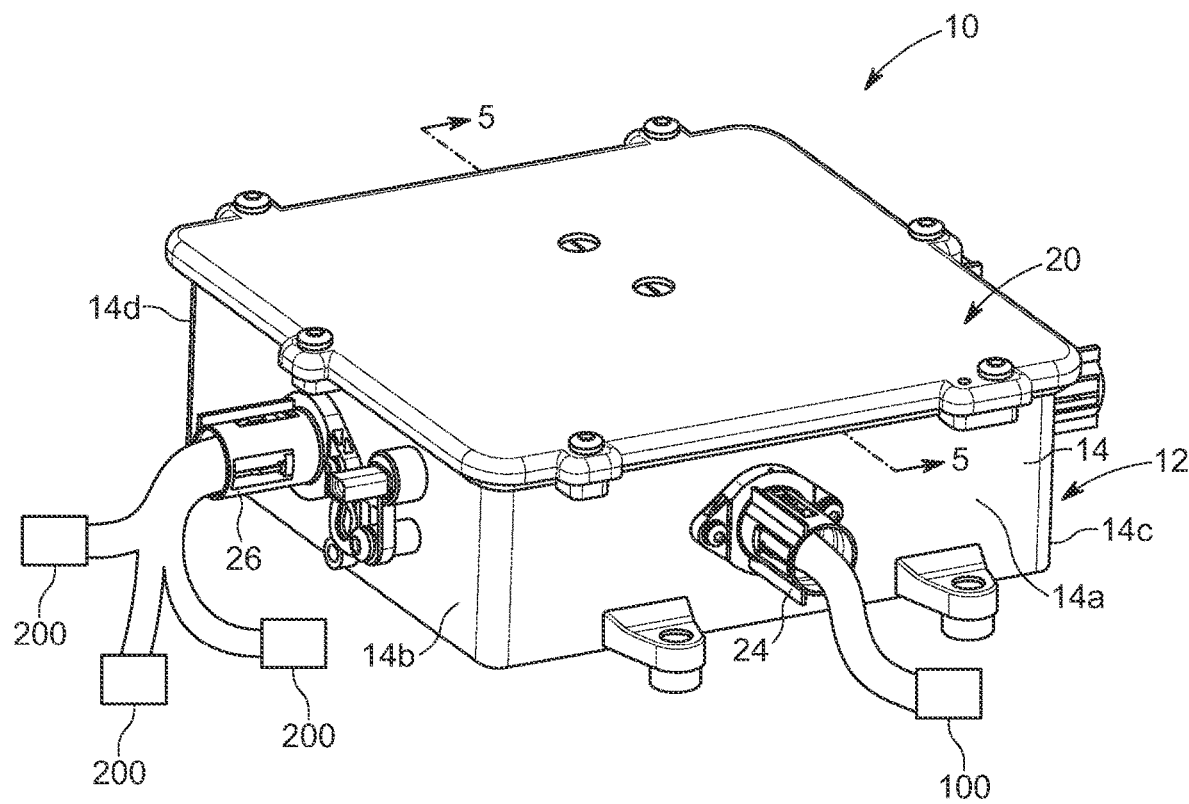
FIG. 1 is an exemplary depiction of an electric junction box assembly according to one or more embodiments illustrated herein.
Figure 2:
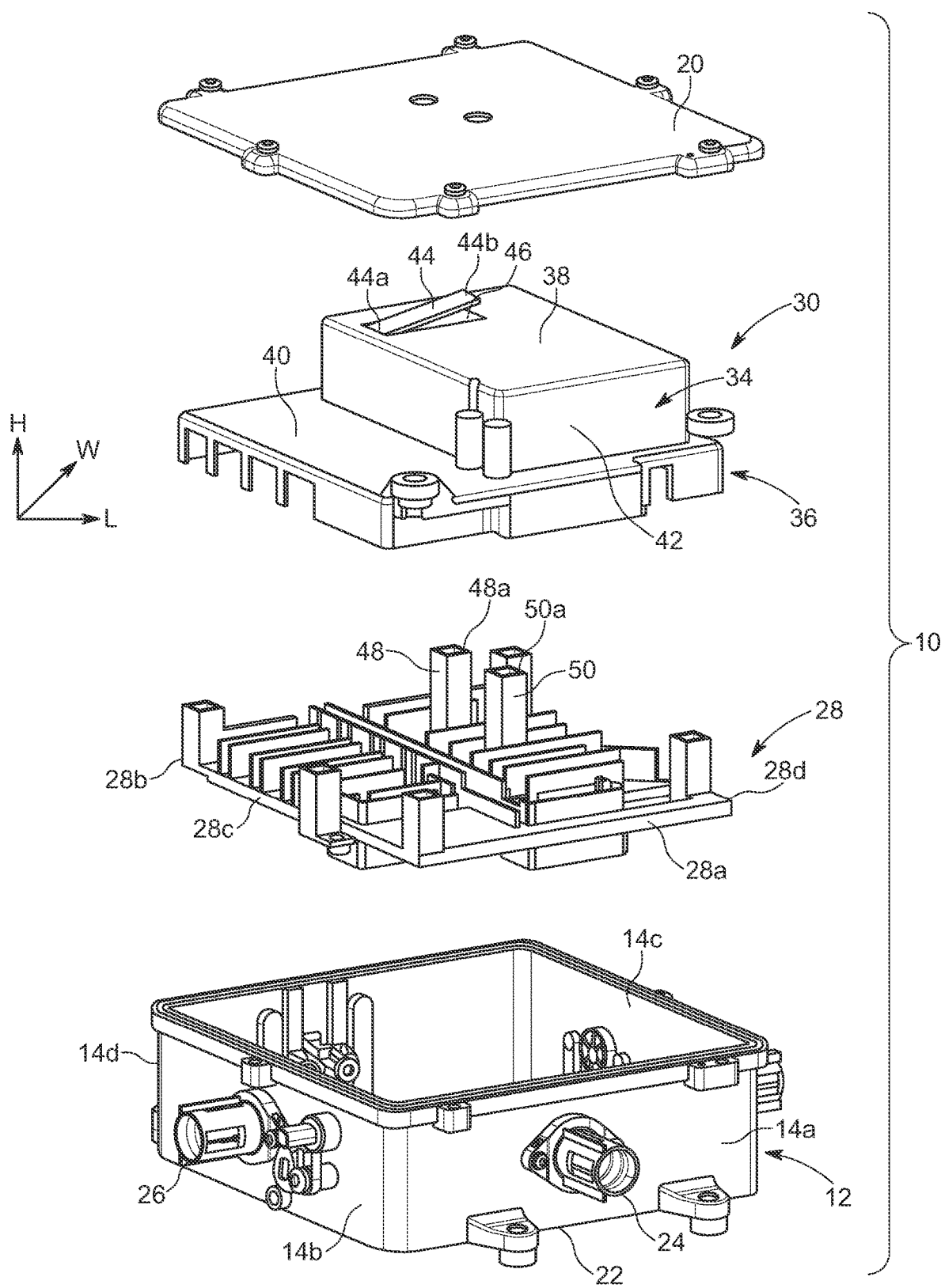
FIG. 2 is an exploded view of the electric junction box assembly shown in FIG. 1.

With reference first to FIGS. 1 and 2, a perspective view of an illustrative embodiment of an electric junction box assembly 10 is provided. The electric junction box assembly 10 is configured to house a plurality of electric components (not shown). Such electric components illustratively include a relay switch, fuses and the like.

The electric components are configured to direct power from a power source such as a battery 100 to various electric devices 200 such as actuators, motors and devices. For illustrative purposes, the electric junction box assembly 10 disclosed herein is described within the context of an automotive vehicle (not shown). However, it should be appreciated that the electric junction box assembly 10 is described herein in the context of an automotive vehicle for illustrative purposes but may be used in other applications. Accordingly, a description of the electric junction box assembly 10 within the context of an automotive vehicle is not limiting to the scope of the appended claims.

With reference again to FIG. 1, the electric junction box assembly 10 includes an outer case 12 having an outer wall 14 bounding a storage space and having a generally cuboidal dimension so as to define container with an open top 16 opposite an open bottom 18. The outer wall 14 may be defined as having a front portion 14a, a pair of side portions 14b, 14c and a back portion 14d. The outer wall 14 is a generally planar member which may be formed of a resilient and durable material suitable for injection molding, illustratively including polypropylene, Acrylonitrile butadiene styrene, polyoxymethylene, polycarbonate and the like.

The outer case 12 may further include a top cover 20 and a closed bottom 22 configured to close the open top 16 and the open bottom 18 respectively. The front portion 14a and the side portion 14b may include a first power terminal 24 and a second power terminal 26 for receiving a first wire 300 and a second wire 302 respectively. The first wire 300 provides power to the electric junction box assembly 10 and the second wire 302 supplies power to the electric devices 200 external to the electric junction box assembly 10. The top cover 20 may be attached to the outer case 12 using conventional fastening means such as a bolt, a screw or a clips.

With reference now to FIG. 2, the electric junction box assembly 10 further includes an inner case 28 disposed within the outer case 12. The inner case 28 is configured to house electric components for routing power, as described in greater detail below. The inner case 28 includes a front portion 28a opposite a back portion 28b and a pair of side portions 28c, 28d connected to each other to define a generally cuboidal member. The upper cover 30 is configured to cover the inner case 28 and protect the electric components supported by the inner case 28. The upper cover 30 and the inner case 28 are a generally planar and resilient member that are not electrically conductive and formed of a material suitable for injection molding, illustratively including polypropylene, Acrylonitrile butadiene styrene, polyoxymethylene, polycarbonate and the like.

The upper cover 30 includes a top wall member 34 and a lip 36 bounding the periphery of the upper cover 30. In one aspect, the top wall member 34 includes a raised portion 38 and the upper cover 30 includes a base portion 40 wherein the raised portion 38 is elevated relative to the base portion 40. Both the raised portion 38 and the base portion 40 are generally planar members having a smooth and continuous surface. In particular, the top wall member 34 includes an upper wall 42 which bounds the raised portion 38. A bottom edge of the upper wall 42 is attached to or integrally formed with the base portion 40 of the upper cover 30. The raised portion 38 is disposed along a plane defined by a width "W" and a length "L" of the electric junction box assembly 10.

The upper cover 20 further includes a prong 44 disposed on the raised portion 38. The prong 44 has a first end 44a which is attached to or integrally formed with the raised portion 38 and a second end 44b opposite the first end 44a that is free of the raised portion 38. The prong 44 is moveable between a compressed state and a protruding state. In the compressed state (shown in FIG. 5), the prong 44 is generally flush with the raised portion 38. In the protruding state (shown in FIG. 6) the second end 44b of the prong 44 projects upwardly from the raised portion 38 of the upper cover 30. In one aspect, the prong 44 may be hingedly connected to the upper cover 30 by virtue of having the first end 44a formed integrally with the upper cover 30 in which case the upper cover 30 includes an inner case opening 46 formed on the upper cover 30 and dimensioned to receive the prong 44.

Figure 3:
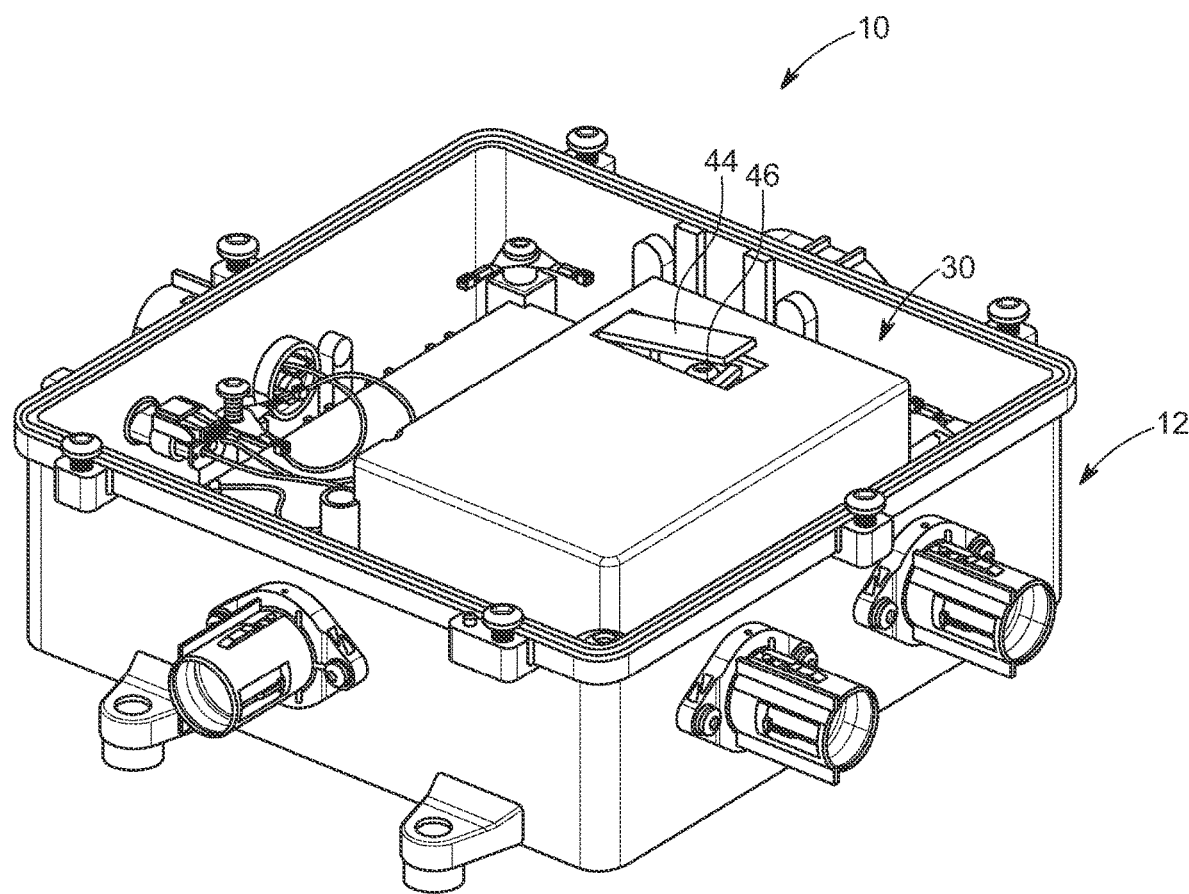
FIG. 3 is a perspective view of the inner case shown in FIG. 1 with the top cover removed.

With reference now to FIG. 3, an illustration of the electric junction box assembly 10 showing the top cover 20 removed is provided. The inner case 28 houses electronic components configured to distribute power from the battery 100. In particular, the inner case 28 houses components configured to place the first power terminal 24, disposed on the exterior of the outer case 12 and connected to the battery 100, in electrical connection with the second power terminal 26 disposed on the exterior of the outer case 12 and coupled to a second wire 302 which is connected to a plurality of electric devices 200. The first and the second power terminal 24, 26 are connected to the electric components within the inner case 28 which includes, inter alia, switches and fuses which regulate and control power supply from the battery 100 to the electric devices 200.

The inner case 28 includes a first tower 48 and a second tower 50 that are disposed in the inner case 28 and are spaced apart from each other. The first tower 48 and the second tower 50 may be molded into the inner case 28 or may be attached to the inner case 28. The first tower 48 and the second tower 50 may be dimensioned the same as each other and are generally elongated members having a top surface 48a, 50a for receiving a first terminal 52 and a second terminal 54. Both the first tower 48 and the second tower 50 includes a fastening bore 56 which may be threaded and configured to receive a first fastener 58, such as a bolt or a screw. The first tower 48 and the second tower 50 may be the same height and may be rectangular column defined by four (4) planar surfaces defining the exterior of the respective first and second towers 48, 50.

The first terminal 52 and the second terminal 54 are electrically conductive members that complete an electric circuit when electrically connected to each other. The first and second terminals 52, 54 may be the same shape and dimension and each includes a clamp portion 60 for clamping onto a wire (not shown). The clamp portion 60 may include a plurality of finger portions which may be bent around a wire to secure the wire and form an electric connection with the wire. The first and second terminals 52, 54 further includes a base member 62 having a first aperture 64. The base member 62 of each of the first and second terminals 52, 54 is registered to a fastening bore 56 of a corresponding first and second towers 48, 50 and the first fastener 58 is inserted through the respective first aperture 64 into a corresponding fastening bore 56 so as to secure the first and second terminals 52, 54 to the corresponding first and second towers 48, 50. Preferably, the first fastener 58 includes a shaft portion 58a which may be threaded and a head portion 58b disposed on a proximal end of the shaft portion 58a. The shaft portion 58a is dimensioned to engage the threads of a fastening bore 56 of corresponding first and second towers 48, 50 and the head portion 58b has a diameter greater than a diameter of the first aperture 64 of the first and second terminals 52, 54.

In one aspect, the wire clamped onto the first terminal 52 is connected to the power source by a bus bar (not shown) and the wire of the second terminal 54 is connected to the second pair of power terminals 26 so as to supply power to the electrical devices external to the electric junction box assembly 10. Accordingly, by electrically connecting the first terminal 52 to the second terminal 54, power from the power source may be distributed to the electrical devices external to the electric junction box assembly 10. Conversely, should the first terminal 52 be disconnected from the second terminal 54, power to the electric junction box assembly 10 is interrupted.

Figure 4A:
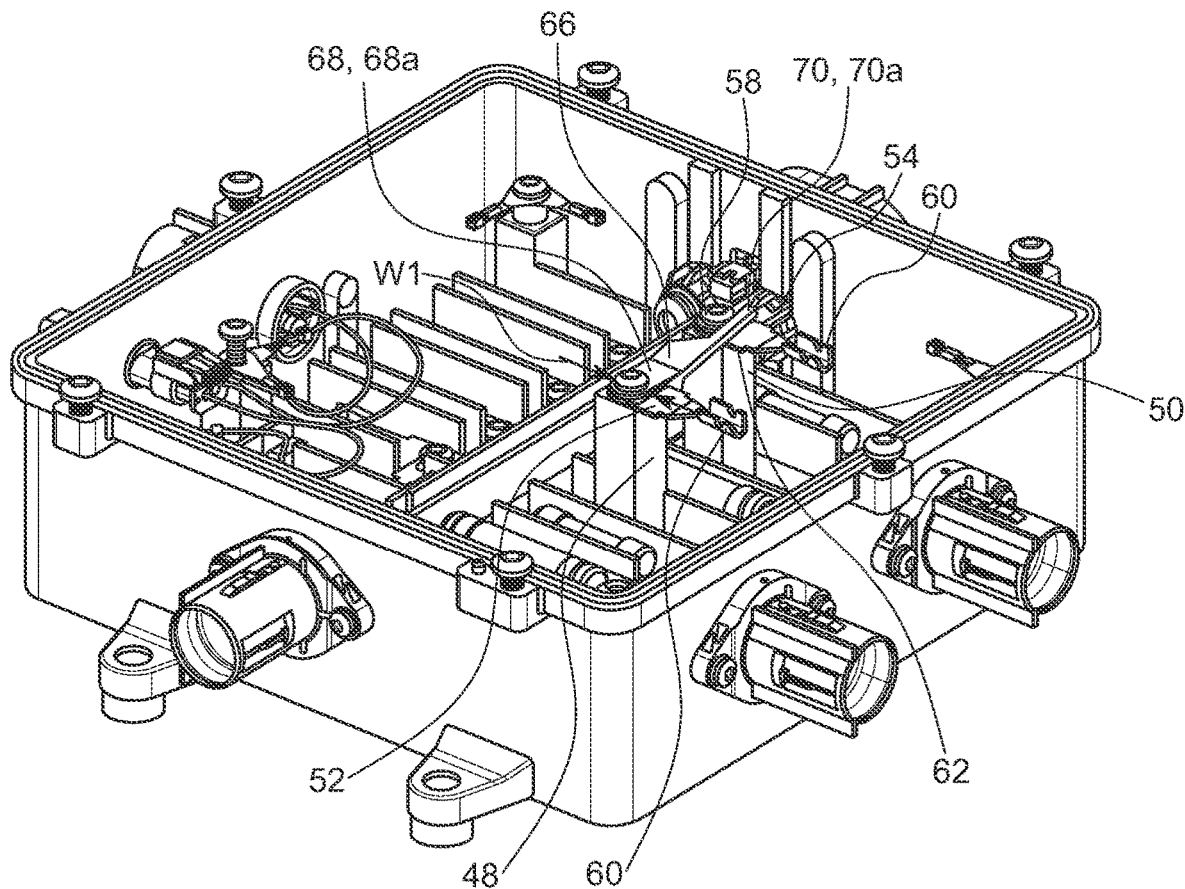
FIG. 4A is an isolated view of the inner case shown in FIG. 3 with the upper cover removed.
Figure 5:
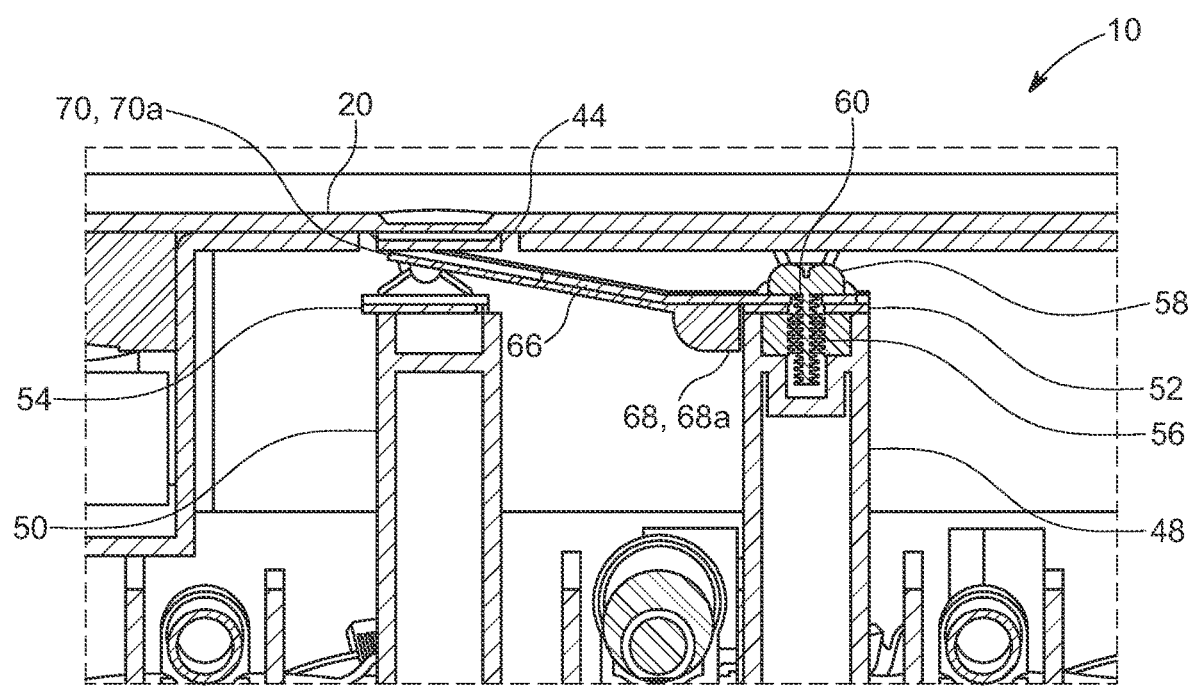
FIG. 5 is a cross-sectional view of FIG. 1 taken along line 5-5.

With reference now to FIGS. 4A and 5, the electric junction box assembly 10 further includes a biasing member 66 disposed in the inner case 28. The biasing member 66 is formed of an electrically conductive material such as steel and is a generally elongated member having a body portion 68 defining a first end 68a and a projection portion 70 defining a second end 70a. The second end 70a is opposite of the first end 68a. For illustrative purposes, the first end 68a is shown as being fixed to the first terminal 52 and extends towards the second terminal 54. The second end 70a is disposed between the second terminal 54 and the prong 44, and is configured to elastically move from and be spaced apart from the second terminal 54. It should be appreciated that the first end 68a of the biasing member 66 may be fixed to one of the first terminal 52 or the second terminal 54, in which case the second end 70a of the biasing member 66 is spaced apart from the other of the first terminal 52 and the second terminal 54.

Figure 4B:
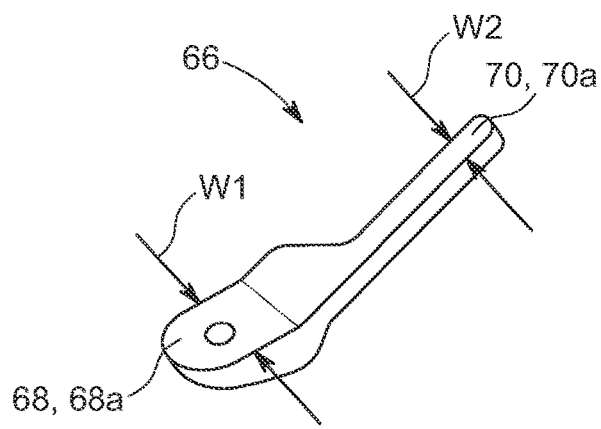
FIG. 4B is an isolated view of the biasing member.

With reference now to FIG. 4B, the first end 68a has a width "W1" and is generally a planar member. The second end 70a is angled with respect to the first end 68a so as to define the projection portion 70. In particular, the second end 70a angles upwardly relative to the first end 68a about a living hinge 72, wherein when the second end 70a is pressed downwardly, the second end 70a is continuously urged to an unloaded position by the living hinge 72. The second end 44b includes a first portion 74 and a second portion 76. The first portion 74 has a width "W2" that tapers into the second portion 76, and the second portion 76 is a generally elongated member having a uniform diameter so as to define a finger. In such an aspect, the biasing member 66 includes a first side edge 78 that is fixed along a first axis and a second side edge 80 opposite of the first side edge 78, wherein the second side edge 80 has a tapered portion 80a interposed between the second portion 76 and the first end 44a.

The biasing member 66 is attached to the first tower 48. In one aspect, the first end 68a of the biasing member 66 includes a second aperture 80 registered to the fastening bore 56 of the first tower 48. The biasing member 66 further includes a seat portion 82 extending downwardly from the first end 68a. The seat portion 82 has a seat surface 84 that is orthogonal to the bottom surface of the first end 68a and is configured to be seated against the first tower 48. The seat portion 82 provides a counter force to the action of the biasing member 66. In particular, the seat portion 82 helps retain the first end 68a of the biasing member 66 in a fixed position when the second end 70a is pressed downwardly.

With reference now to FIGS. 5 and 6, a cross-sectional view of the electric junction box assembly 10 is provided. The top surface of the first tower 48 and the second tower 50 are spaced apart from the inner surface of the upper cover 30 so as to define a gap 86. The gap 86 is sufficient to receive the head portion 58b of a respective first fastener 58 and keep the head portion 58b spaced apart and free from the upper cover 30. A difference in distance between a top surface of the second terminal 54 and the inner surface of the upper cover 30 is substantially equal to a thickness "TH" of the biasing member 66 so as to place the biasing member 66 into contact with the first terminal 52 when the top cover 20 is attached to the outer case 12. In particular, the difference in distance between the top surface of the second terminal 54 and the inner surface of the upper cover 30 may be substantially equal to a thickness of the projection portion 70 of the biasing member 66 so as to place the projection portion 70 into electric contact with the second terminal 54, thereby placing the first terminal 53 into electric contact with the second terminal.

With reference again to FIGS. 1 and 2, the top cover 20 may be secure to the outer case 12 by conventional fastening mechanisms. For instance, the top cover 20 may be configured with at least one bolt hole 88 and the outer case 12 may be configured with at least one bore 90 for receiving a second fastener 92 to secure the top cover 20 to the outer case 12. In the current embodiment, the top cover 20 includes four (4) bolt holes 88 and the outer case 12 includes four bores 90, each configured to receive a second fastener 92 to secure the top cover 20 to the outer case 12. When the top cover 20 is secured, the bottom surface of the top cover 20 contacts the top surface of the upper cover 30 and in doing so, the prong 44 is pushed down, and pushes the projection portion 70 of the biasing member 66 into electric contact with the second terminal 54, as shown in FIG. 5.

In operation, the electric junction box assembly 10 may be installed in an automotive vehicle (not shown) wherein a first harness 300 couples the battery 100 to the first power terminal 24 of the electric junction box assembly 10 and a second wire 302 is connected to a plurality of electric devices 200. When assembled, the top cover 20 is configured to press the resilient prong 44 into the compressed state wherein the prong 44 is pressed against the second end 70a of the biasing member 66 to place second end 70a of the biasing member 66 into electric contact with the second terminal 54. Accordingly, the biasing member 66 forms an electric connection between the first terminal 52 and the second terminal 54 when the top cover 20 is mounted onto the outer case 12. If maintenance is desired, the top cover 20 is simply removed which allows the resilient prong 44 to move to the protruding state, wherein the second end 70a of the biasing member 66 projects upwardly and the second end 44b of the prong 44 is free of the biasing member 66. In the protruding state, the biasing member 66 returns to its natural position by operation of the living hinge 72 and the second end 70b of the biasing member 66 projects upwardly from the second terminal 54, thereby disconnecting power. It should be apparent to those skilled in the art, that should the body portion 68 of the biasing member 66 be fixed to the second terminal 54, the prong 44 would be disposed on the upper cover 30 so as to be positioned above the first terminal 52 and the operation of the electric junction box assembly 10 is the same as described above.

Accordingly, the electric junction box assembly 10 disclosed herein allows power to be disconnected by simply removing the top cover 20 so as to allow for maintenance to be performed.

While particular embodiments have been illustrated and described herein, it should be appreciated and understood that various other changes and modifications may be made without departing from the spirit and scope of the claim subject matter. Moreover, although various aspects of the claim subject matter have been described herein, such aspects need not be utilized in combination. It is therefore intended that the appended claims cover all such changes and modifications that are within the scope of the claim subject matter.

The invention claimed is:

1. An electric junction box assembly for distributing power from a battery to a plurality of electric devices, the electric junction box assembly comprising:
    an outer case having an open top;
    a top cover configured to close the open top;
    an inner case disposed in the outer case, the inner case including an open top and an upper cover configured to close the open top, the upper cover including a resilient prong;
    a first terminal spaced apart from a second terminal, the first terminal and the second terminal disposed in the inner case; and
    a biasing member formed of an electrically conductive material, the biasing member having a first end fixed to one of the first terminal and the second terminal and a second end spaced apart from the other of the first terminal and the second terminal; and
    wherein the resilient prong is disposed above the second end of the biasing member, the top cover configured to press the resilient prong is against the second end of the biasing member to place the first terminal in electric contact with the second terminal when the top cover is mounted onto the outer case and allow the resilient prong to be free of the second end of the biasing member when the top cover is removed so as to allow the second end of the biasing member to be spaced apart from the other of the first terminal and the second terminal and disconnect power.

2. The electric junction box assembly as set forth in claim 1 further including a first tower spaced apart from a second tower, the first tower and the second tower are disposed in the inner case, wherein the first terminal is mounted on the first tower and the second terminal is mounted on the second tower.

3. The electric junction box assembly as set forth in claim 2, wherein the biasing member includes a body portion and a projection portion, the projection portion angled relative to the body portion.

4. The electric junction box assembly as set forth in claim 3, wherein the body portion includes an aperture for attachment to the one of the first terminal and the second terminal.

5. The electric junction box assembly as set forth in claim 4, wherein the projection portion includes a first portion and a second portion, the first portion tapers to the second portion.

6. The electric junction box assembly as set forth in claim 5, wherein the second portion is a finger having a uniform diameter.

7. The electric junction box assembly as set forth in claim 5, wherein the biasing member includes a seat portion extending downwardly from the first end.

8. The electric junction box assembly as set forth in claim 7, wherein the seat portion has a seat surface that is orthogonal to a bottom surface of the first end.

9. The electric junction box assembly as set forth in claim 2, wherein the first tower and the second tower are a same height.

10. The electric junction box assembly as set forth in claim 2, wherein the resilient prong is hingedly connected to the upper cover.

11. The electric junction box assembly as set forth in claim 10, wherein the resilient prong is a planar member configured to cover an inner case opening.

12. The electric junction box assembly as set forth in claim 3, wherein a difference in a distance between a top surface of the other of the first terminal and the second terminal and an inner surface of the upper cover is substantially equal to a thickness of the biasing member.

13. The electric junction box assembly as set forth in claim 12, wherein the difference between the top surface of the other of the first terminal and the second terminal and the inner surface of the upper cover is substantially equal to a thickness of the projection portion of the biasing member.

14. The electric junction box assembly as set forth in claim 2, wherein a top surface of the one of the first terminal and the second terminal is spaced apart from an inner surface of the upper cover.

15. The electric junction box assembly as set forth in claim 2, wherein the top cover includes at least one bolt hole and the outer case includes a bore configured to receive a first fastener, the at least one bolt hole registered to the bore when the top cover is mounted and the first fastener is seated in the at least one bolt hole and the bore to secure the top cover to the outer case.

16. The electric junction box assembly as set forth in claim 15, wherein a bottom surface of the top cover contacts a top surface of the upper cover when the top cover is mounted.

* * * * *